(12) United States Patent
Thomann et al.

(10) Patent No.: US 6,330,194 B1
(45) Date of Patent: Dec. 11, 2001

(54) HIGH SPEED I/O CALIBRATION USING AN INPUT PATH AND SIMPLIFIED LOGIC

(75) Inventors: Mark R. Thomann; Terry R. Lee, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/603,627

(22) Filed: Jun. 26, 2000

(51) Int. Cl.$^7$ ........................................... G11C 7/00
(52) U.S. Cl. .................. 365/189.05; 365/189.07; 365/189.11
(58) Field of Search .................. 365/189.05, 189.07, 365/189.11, 194, 210; 327/239, 245

(56) References Cited

U.S. PATENT DOCUMENTS 6,160,755 * 12/2000 Norman et al. ................. 365/233
6,172,542 * 1/2001 Williams et al. ................ 327/239

* cited by examiner

Primary Examiner—Son T. Dinh
(74) Attorney, Agent, or Firm—Dickstein Shapiro Morin & Oshinsky LLP (57) ABSTRACT

The present invention provides a calibration circuit for data paths DQ0 . . . DQN of a memory device by using a masking data path and an output buffer circuit provided therein in the calibration process. Calibration of the masking data path output buffer circuit is achieved and the calibrate results are transferred to each of the buffer amplifiers in the data paths DQ0 . . . DQN.

66 Claims, 6 Drawing Sheets

HIGH SPEED I/O CALIBRATION USING AN INPUT PATH AND SIMPLIFIED LOGIC

FIELD OF THE INVENTION

The present invention relates to an output buffer driver calibration circuit and calibration method for reducing timing uncertainty in high speed signaling systems.

BACKGROUND OF THE INVENTION

High-speed signaling systems use an output buffer driver calibration scheme to reduce timing uncertainty. The need for a calibration scheme is particularly important in bussed systems, where there are several different output buffer drivers that may drive the bus, or where there are several different output buffer drivers that drive a portion of a wide bus. Calibrated output buffer drivers reduce the timing uncertainty by matching the driver output from one output buffer driver to another, by matching the characteristics of a pull up transistor (e.g., a transistor that drives a high voltage) to the characteristics of a pull down transistor (e.g., a transistor that drives a low voltage), by setting an effective output impedance that helps to back-terminate transmission line reflections in the bus system, and by limiting the output voltage slew rates to improve transmittal signal integrity. Some of the benefits obtained by calibrated output buffer drivers can be achieved by closely specifying the driver characteristics for all transistors in an output buffer driver and all output buffer drivers in a system. Techniques such as specifying minimum and maximum output currents, specifying the current versus voltage curves with minimum and maximum limits, and by providing limits on the minimum and maximum slew rates have been used. However, an active calibration scheme can reduce the timing uncertainty further by adjusting out the effects of process variance, voltage variation or temperature variation on output buffer drivers.

In high-speed systems that use parallel bus termination, such as Rambus or SLDRAM, output buffer driver calibration has been implemented by comparing the voltage at the buffer driver output while it is driving high or low, and while the bus is connected through a parallel resistor, to another voltage. The other voltage is often termed VTT, and the VTT voltage level is set by system considerations. The resistor connection to VTT establishes the load current for normal operation, and for the calibration circuit.

In high-speed systems which do not use any form of parallel termination, the proper output buffer driving characteristics are even more critical for reducing timing uncertainty. In these systems, there is no parallel resistor on the bus to terminate the reflections, so the signal integrity relies on the output buffer driver ON impedance to back terminate any reflections in the system. Also, the output buffer driver slew rate can be quite sensitive to the driver characteristics, when there is no DC load provided by a termination resistor.

A calibration scheme has been proposed for non-terminated systems that uses a pull up transistor in an ON state of one output buffer driver as the load to the pull down transistor of a different output buffer driver, and vice versa. However, this will not guarantee that the VOH (logic output high voltage) will be symmetric about a mid-voltage (often called $V_{Ref}$) to VOL (logic output low voltage). Rather, this scheme will match the ON resistance of output buffer driver A pull down transistor to the ON resistance of output buffer driver B pull up transistor. Likewise the ON resistance of output buffer driver A's pull up transistor will be calibrated to the ON resistance of output buffer driver B's pull down transistor. If the drive strength of driver B pull up transistor is mismatched to its pull down transistor, then this relationship will be replicated in driver A after calibration. A mismatch of the pull up transistor characteristic with the pull down transistor characteristic will create a different tuning relationship with signals transitioning to a logic one state versus signals transitioning to a logic zero state. This results in a timing uncertainty in the system, which will limit the maximum system operational data rate.

A further limitation of the above approach, is that there are often situations where it is desirable for an output buffer driver at one end of the bus to have a different drive strength than an output buffer driver at the other end of the bus, due to differences in the bus topology that each driver drives. An example of this situation is with a memory controller that drives multiple DRAMs from one end of the bus, and the DRAM which may actually be at an intermediate portion of the bus, as opposed to one end of the bus. With the above calibration scheme, it would not be possible to retain different drive strengths for different output buffer drivers. A final disadvantage of this approach is that there can be risk of device latch-up when two separate drivers drive a bus simultaneously. A driver that has SCR latch up will not allow calibration to occur, and it is usually necessary to remove and re-apply the power supply voltage to exit the latch up condition.

SUMMARY OF THE INVENTION

The present invention provides a simple output driver calibration circuit and calibration method which reduces timing uncertainty in high speed signaling systems. The invention may be applied to both terminated and non-terminated bus systems. The invention uses an output buffer connected to an input/output data path of a memory device, for example a data mask path, to calibrate the other input/output DQ data paths of the memory device.

For purposes of simplifying the description, the invention will be described in the context of a data mask path. Normally, the data mask path of a memory device receives a data mask command from an external DM pin and prevents certain memory functions from occurring even though data may be present on the DQ data paths. The data mask path typically has similar capacitance and signal pass characteristics as DQ input/output data paths of the memory device. An output buffer driver is normally not provided in the data mask path, since that path is normally an input only data path; however, an output buffer is provided for this path in the invention. The buffer driver for the data mask path is only used during calibration. During calibration, pull up and pull down transistors in the data mask path output buffer driver are simultaneously turned on. The resulting output voltage on the data mask path is compared to a reference voltage that is set for the appropriate ratio of pull up to pull down drive strength. If the output voltage is above or below the reference voltage, the drive strength of the pull up or pull down transistor of the data mask path driver can be increased or decreased, by command in one or more steps, to equalize the output voltage to the desired reference voltage setting. The output buffer drivers for the input/output DQ data paths are adjusted to obtain the same signal driving characteristics as the buffer driver for the data mask path. Once this calibration is achieved, the buffer driver of the data mask path is disabled so the data mask path can perform its normal memory device data mask functions.

BRIEF DESCRIPTION OF THE DRAWINGS

The above and other advantages and features of the invention will be more clearly understood from the following detailed description of the invention which is provided in connection with the following drawings.

DETAILED DESCRIPTION OF THE PREFERRED EMBODIMENTS

The present invention provides an output buffer driver calibration circuit and associated method which does not require the use of two separate drivers driving a bus line simultaneously during the calibration operation. In addition, the invention ensures that the calibration scheme adjusts the VOH and VOL levels to be symmetric about a midpoint voltage, $V_{Ref}$, and avoids the use of additional extra signal pins to an output buffer driver circuit for purposes of calibration.

The invention provides an output buffer for an input/output data path that is used with a reference driver for performing calibration. The input/output data path which is used may be a data mask input path which is connected to an external data mask (DM) pin of the memory device. However, the invention is not limited to use of this input path, as other input data paths can also be used. For simplification, the invention is described below in the context of using the data masking path. The data mask path is typically fabricated like the DQ data paths in a memory device, and this has similar electrical properties, such as line capacitance, as the DQ data paths. The data mask path output buffer is selectively operated only during calibration to drive the data mask path to provide a driving signal thereon. This driving signal is compared with reference signal $V_{Ref}$ and the driving strength characteristics of this output buffer are adjusted until a predetermined relationship exists between the driving signal and $V_{Ref}$, e.g., they are substantially equal. The buffer drivers of DQ data paths are adjusted to have the same driving strength characteristics as the adjusted device strength of the data mask path buffer driver.

Figure 1:
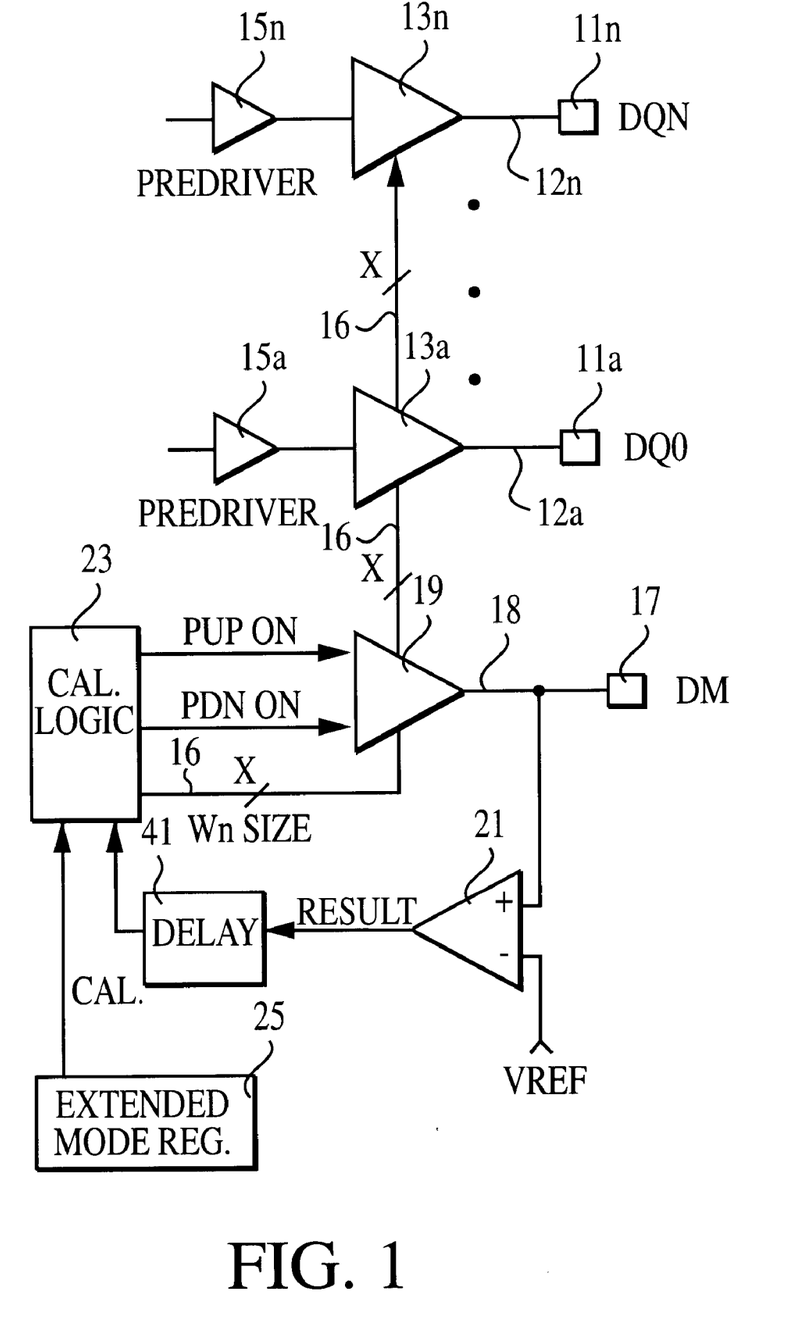
FIG. 1 illustrates a calibration circuit in accordance with an exemplary embodiment of the invention.

An exemplary embodiment of the invention is illustrated in FIG. 1. FIG. 1 illustrates a portion of a memory device which includes input/output data pins DQ0 . . . DQN and an additional data pin DM which is typically used for receiving a data masking command from a bus. The data masking command is typically used to prevent the memory device from writing any data that may be present on the DQ0 . . . DQN bus. Normally, the DM pin is an input only pin, as no signals are applied by the memory device to the DM pin.

As illustrated in FIG. 1, each of the data paths which ultimately terminate at the DQ0 . . . DQN pins includes within the data path a predriver circuit $15_n$, a buffer amplifier 13 and the connection line between the buffer amplifier 13 and the actual input/output pin $11_n$. Each of the buffer amplifiers $13_a$ . . . $13_n$ may have their drive strength commonly adjusted in accordance with a control signal applied on line 16. The control signal applied to line 16 to set the strength adjustments for the driver circuits within each buffer amplifier $13_a$ . . . $13_n$ originates at a calibration logic circuit 23. The adjustment signal on line 16 is also applied to an output buffer circuit 19 which is added to a memory device in order to provide an output signal on a mask data path 18 which is connected to the DM pin 17 of the memory device.

Figure 4:
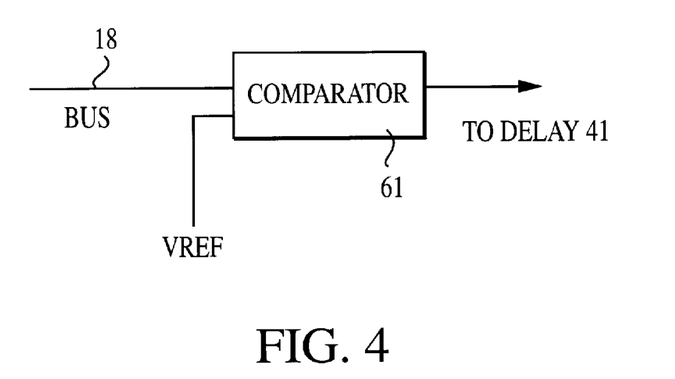
FIG. 4 illustrates an alternative comparison structure which can be used in the FIG. 1 exemplary embodiment.

FIG. 1 further illustrates a comparison circuit 21 which may be a normal receiver amplifier for the data path 18 or which may be a separate comparator circuit 61, as illustrated in FIG. 4. The output of comparison circuit 21 passes through delay circuit 41 and is provided as an input to the calibration logic circuit 23. The calibration logic circuit also receives a calibration command signal from an extended mode register 25 which is part of the memory device.

Figure 2:
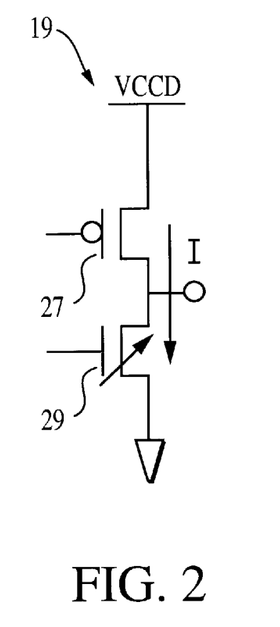
FIG. 2 illustrates a buffer driver circuit which is used in the FIG. 1 exemplary embodiment.

The construction of each of the buffer amplifiers 19 and $13_a$ . . . $13_n$ is illustrated in FIG. 2. Each includes a pull up transistor 27 and a pull down transistor 29. During a calibration mode, the buffer driver 19 for the data mask signal path 18 has both transistors 27 and 29 turned on at the same time by the calibration logic circuit 23. This occurs in response to the calibration logic circuit 23 receiving a calibration command from the extended mode register 25.

Figure 5:
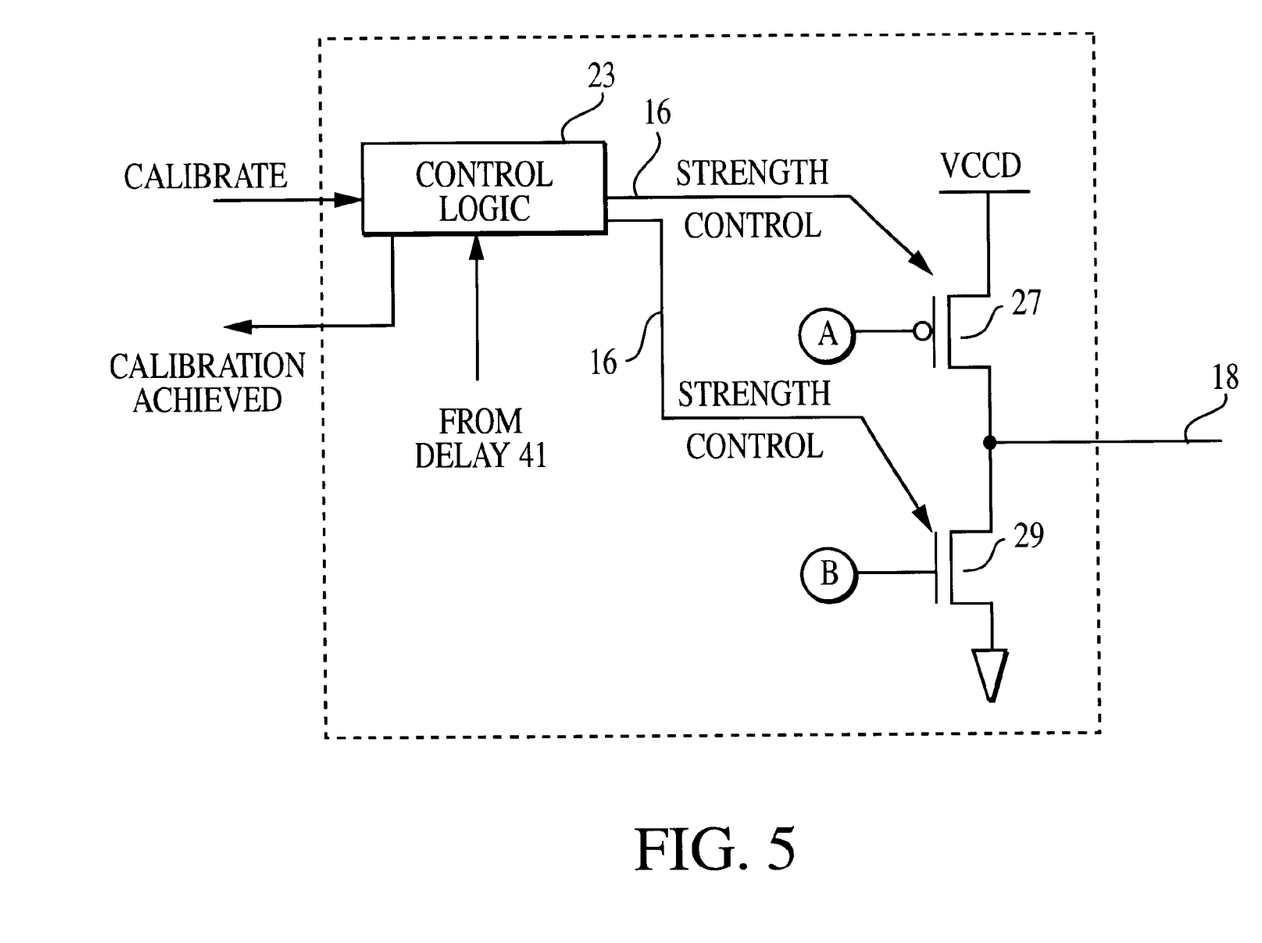
FIG. 5 illustrates the manner in which the pull up and pull down transistors of a buffer amplifier are varied in strength in accordance with the FIG. 1 exemplary embodiment of the invention.

Transistors 27 and 29 of driver circuit 19 may be turned on in sequence or at the same time, but during a calibration mode it is required that both transistors 27 and 29 be on at the same time to provide a current in the manner illustrated in FIG. 2 to produce a driving signal on the mask data path 18. This is accomplished by appropriately driving the gate terminals A and B of the pull up and pull down transistors, as shown in FIG. 5.

When the calibration logic 23 turns both the pull up transistor 27 and the pull down transistor 29 of driver circuit 19 on at the same time, it produces a buffer driving signal on the mask data path 18 which is in turn received by comparator 21. Comparator 21 compares the drive signal on data path 18 with a reference signal $V_{Ref}$ and produces an output signal which indicates an error signal between the two which passes through delay circuit 41 and is applied to the calibration logic circuit 23. The calibration logic circuit 23 receives the error signal at the output of comparison circuit 29 and determines how the drive strength of buffer driver 19 needs to be adjusted so that the output signal on mask data path 18 has a predetermined relationship with respect to the reference signal $V_{Ref}$, e.g., it substantially matches the reference signal $V_{Ref}$.

The calibration logic circuit 23, in response to the error signal from comparison circuit 21, may increase or decrease the drive strength of either the pull up or pull down transistor 27, 29 of buffer driver 19 in order to cause the output of the buffer driver 19 to more closely approach the reference signal $V_{Ref}$. The calibration logic circuit 23 may be set to adjust the drive strength of buffer driver 19 to obtain zero or null output circuit signal from comparison circuit 21 in one adjustment step. Calibration of the output of driver 19 thus is completed, and subsequent calibration commands can be ignored. However, other calibration methods are possible. For example, another method for adjusting the buffer 19 drive strength is to have the calibrate logic 23, in response to the error signal at the output of comparison circuit 21, make an incremental adjustment in drive strength to produce a changed output on line 18, which is again compared to the reference voltage $V_{Ref}$ by comparison circuit 21. This process repeats until the predetermined relationship, e.g., a substantial match, exists between the output of driver 19 and $V_{Ref}$.

Another calibration method for adjusting the buffer 19 drive strength is to perform a single incremental adjustment in drive strength in response to each of a series of individual calibration commands received by calibration logic circuit 23. Calibration logic circuit 23 may then perform an incremental adjustment, if needed, in response to each calibration command received. If a zero or null output signal from comparison circuit 21 is achieved, succeeding calibration commands in the series received are ignored. This implementation simplifies the logic required at the calibration logic circuit 23.

In other words, the calibration logic circuit 23 operates to make incremental changes in the drive strength of the buffer driver 19, as dictated by the output of the comparison circuit 21, until the driving signal on the mask data path 18 has the predetermined relationship to, e.g., matches, the reference voltage $V_{Ref}$.

The drive strength adjustment by the calibration logic circuit 23 appears on line 16, and it is this control signal which causes the buffer driver 19 to change its drive strength. The manner in which this occurs is illustrated in FIG. 5. As shown therein, the control logic circuit 23 actually sends strength control signals along line 16 which varies the drive strength of at least one of the pull up 27 and pull down 29 transistors to thereby change the drive signal applied to the data path 18.

Figure 3:
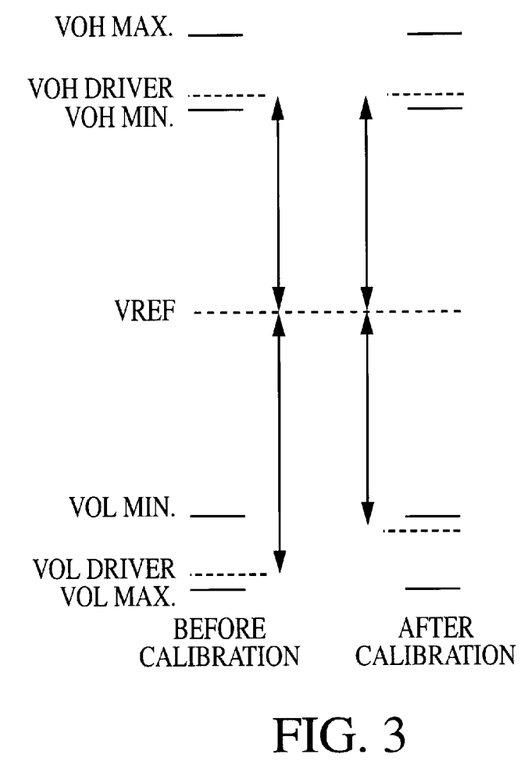
FIG. 3 illustrates a graph of the calibration operations performed in accordance with the FIG. 1 embodiment.

FIG. 3 illustrates a before and after result of a calibration process which occurs with the exemplary embodiment of the invention illustrated in FIG. 1. The left side of FIG. 3 illustrates an uncalibrated buffer driver 19. As shown in this example, the pull down transistor 29 is providing too much drive strength compared to the pull up transistor 27. As a consequence, the drive strength mid point will deviate from the reference voltage $V_{Ref}$. If all of the buffer drivers $13_a \ldots 13_n$ of the DQ data paths are considered, each will have its own unique drive strength characteristic based on the drive strength of the transistors in the respective buffers $13_a \ldots 13_n$ and other signal path characteristics.

The invention calibrates all of the buffer drives $13_a \ldots 13_n$ of the data paths DQ0 . . . DQN to a common reference voltage $V_{Ref}$. To this end, the same drive strength adjustments which are provided by the calibration logic circuit 23 to the buffer driver 19 are also applied to the buffer drivers $13_a \ldots 13_n$ of each of the data paths $12_a \ldots 12_n$. In this manner, all data path buffer drivers $13_a \ldots 13_n$ are calibrated to the same drive strength adjustments which are made to buffer driver 19.

The right side of FIG. 3 illustrates the result of a calibration operation which has been performed on buffer amplifier 19 and on each of the remaining buffer amplifiers $13_a \ldots 13_n$ of the data paths $12_a \ldots 12_n$ which are coupled to the data input/output pins DQ0 . . . DQN. As shown on the right side of FIG. 3, each data path is now calibrated to a $V_{Ref}$ where $V_{Ref}$ is substantially in the middle of the voltage swings provided by each of the driving buffer amplifiers $13_a \ldots 13_n$.

The calibration logic circuit 23 can be set to alter the drive strengths of each of the buffer drivers $13_a \ldots 13_n$ at the same time as it makes the corresponding changes to the buffer driver 19 during the calibration process. Alternatively, the calibration logic 23 can be set to first make the necessary changes to the buffer driver 19, and after this buffer amplifier is calibrated, then send the same and final strength adjustment changes to each of the buffer drivers $13_a \ldots 13_n$.

Once calibration is completed, and each of the buffer amplifiers $13_a \ldots 13_n$ has had its drive strength adjustment made, the calibration process ceases. At this point, it is no longer necessary for the buffer 19 to be connected to the mask data path 18, and it is therefore disconnected by the calibration logic circuit 23, which turns off both the pull up and pull down transistors 27 and 29 with appropriate signals to the A and B inputs of the transistors, as shown in FIG. 5. Now the data mask path 18 can be used the way it is normally used in a memory device for a data masking operation.

Although the calibration logic circuit 23 may adjust the drive strengths of either the pull up or pull down transistors, the calibration logic circuit 23 can be set to adjust only one of the pull up or pull down transistors. In particular, a preferred arrangement would be to adjust only the pull down transistor. In this case, the pull down transistor can first be set to a minimum strength value by the control logic circuit 23 which can be adjusted up incrementally until it achieves a balanced drive with the pull up transistor. Of course, it is also possible to set the pull down transistor to a maximum drive strength with the calibration logic circuit 23 and thereafter the calibration circuit 23 can adjust the strength down until there is a balanced drive of the pull down transistor with the pull up transistor.

With this type of arrangement only one of the pull up and pull down device needs to be varied. Since the pull up device is typically a P channel device and the pull down device is typically an N channel device which is much smaller than the P channel, adjustment of the pull down N channel device is preferred. Because an N channel device is much smaller than a P channel device, providing an N channel device with the required strength adjustment circuitry would consume less die area then if the same circuitry was provided for the P channel device. Adjusting the pull down strength also results in a smallest possible capacitance and the simplest driver circuitry.

The buffer driver 19 used for the calibration may be a scaled down version of the actual output drivers $13a \ldots 13n$ for the memory device. This implementation offers the advantage of a smaller input capacitance at input DM pin 17, thus simplifying the high speed output path of the DQ drivers, since the DQ driver path does not require extra control logic.

Figure 7:
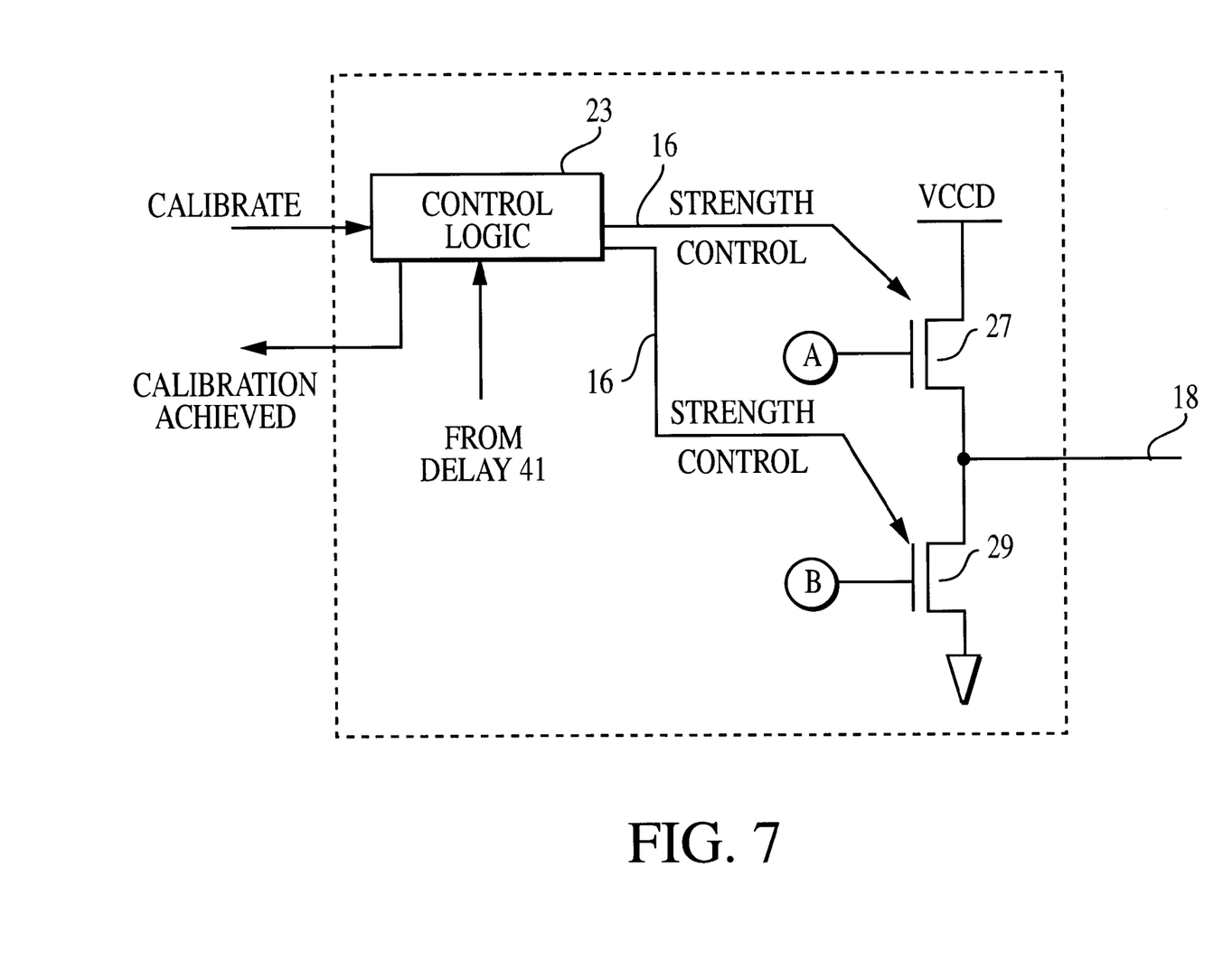
FIG. 7 illustrates the manner in which the pull up and pull down transistors of a buffer amplifier are varied in strength in accordance with an alternate embodiment of the invention.
Figure 8:
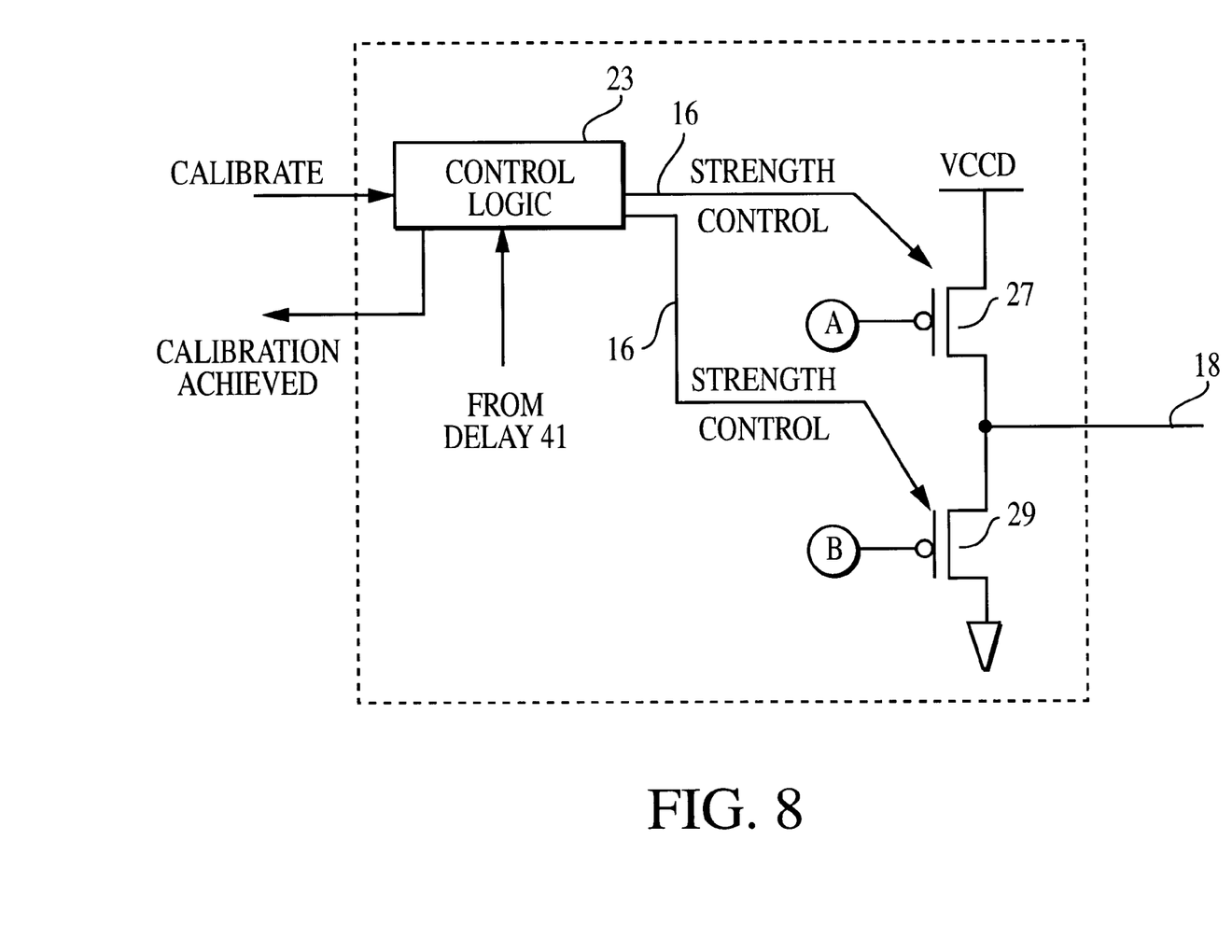
FIG. 8 illustrates the manner in which the pull up and pull down transistors of a buffer amplifier are varied in strength in accordance with another alternate embodiment of the invention.

Although the invention has been described above with respect to a P channel pull up device 27 and an N channel pull down device 29, it is also possible to construct the invention using a pair of N channel devices, as shown in FIG. 7, or using a pair of P channel devices, as shown in FIG. 8, driven using appropriate signals to the A and B inputs of the devices, as described above.

Although the invention has been described above in the context of a data masking path, any input/output data path may be used. The input/output data path which is used with a reference driver for performing calibration may be a data mask input path, as described above, which is connected to an external data mask (DM) pin of the memory device. However, the invention is not limited to use of this input path, as other input data paths may also be used.

The present invention will find utility in any device which uses output buffer devices to apply signals to a transmission path, such as a bus. For example, the invention may be employed in a processor or memory device of any processor based system, such as the one illustrated as 200 in FIG. 6.

Figure 6:
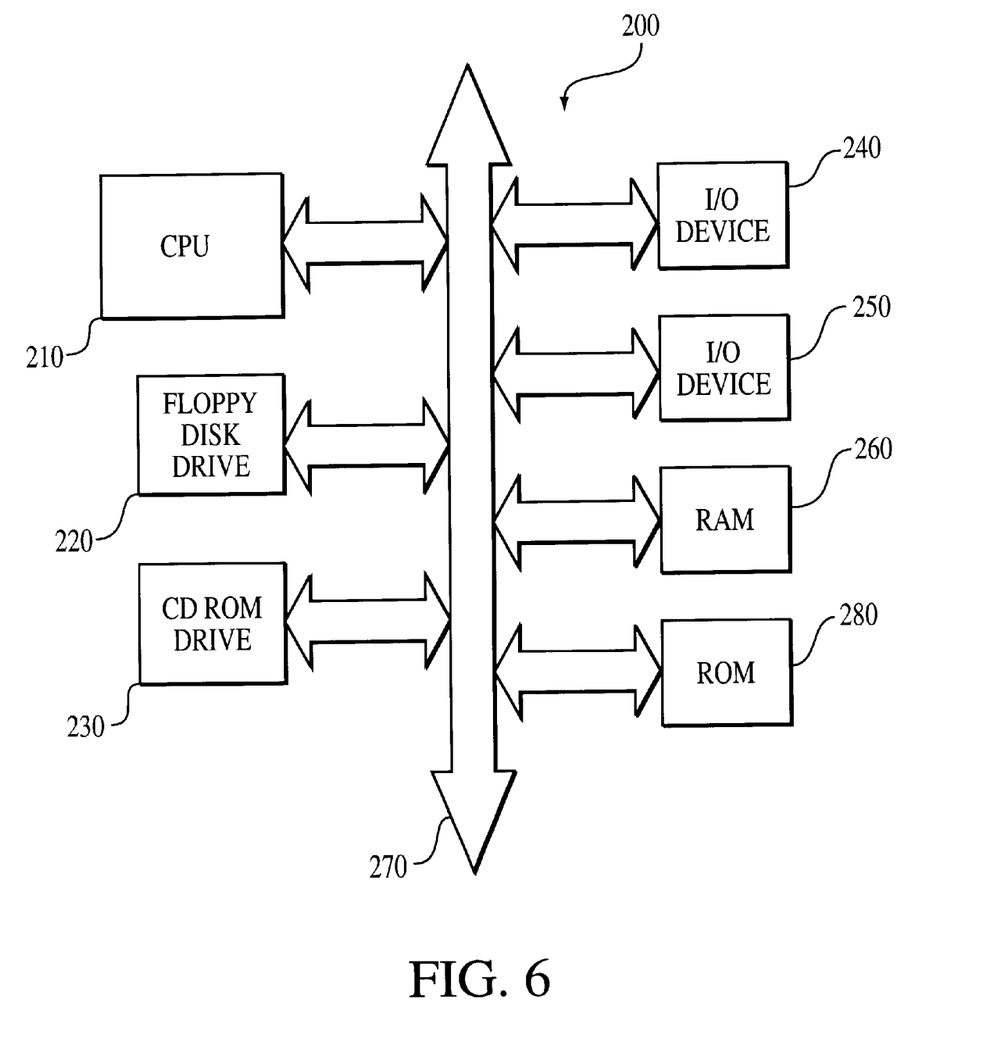
FIG. 6 illustrates a processor based system with which in a memory device containing the invention may be used.

As shown in FIG. 6, a processor based system, such as a computer system, for example, generally comprises a central processing unit (CPU) 210, for example, a microprocessor, that communicates with one or more input/output (I/O) devices 240, 250 over a bus 270. The computer system 200 also includes random access memory (RAM) 260, a read only memory (ROM) 280 and, in the case of a computer system may include peripheral devices such as a floppy disk drive 220 and a compact disk (CD) ROM drive 230 which also communicate with CPU 210 over the bus 270. At least one of CPU 210 and one or more integrated circuits connected thereto, such as employed for RAM 260 and ROM 280, are preferably constructed as integrated circuits which include a calibration circuit for calibrating the characteristics of output buffer drivers as previously shown and described with respect to FIGS. 1–5. It may also be desirable to integrate the processor 210 and memory 260 on a single IC chip and have one or both of processor 210 and memory 260 employ the calibration circuit shown and described with reference to FIGS. 1–5.

Although the invention has been described above in connection with exemplary embodiments, it is apparent that many modifications can be made without departing from the spirit or scope of the invention.

Accordingly, the invention is not to be considered as limited by the foregoing description, but is only limited by the scope of the appended claims.

What is claimed as new and desired to be protected by Letters Patent of the United States is:

1. A method of calibrating signal drivers for respective data paths of a memory device, said method comprising:
operating a first signal driver to produce a driving signal on an input data path of said memory device,
comparing the output signal from said first signal driver with a reference signal to produce a control signal;
adjusting the driving strength characteristics of said first signal driver in response to said control signal to obtain a predetermined relationship between said output signal and said reference signal in response to the result of said comparison; and
adjusting the driving strength characteristics of a plurality of second signal drivers, respectively provided to drive a plurality of additional data paths, in accordance with the driving strength adjustments made to said first signal driver.

2. A method as in claim 1 wherein said first signal driver has pull up and pull down driving elements for driving said input data path and the drive strength of said at least one of said pull up and pull down driving elements is adjusted in response to the result of said comparison operation.

3. A method as in claim 2 wherein said comparison is performed when said pull up and pull down driver elements are both turned on.

4. A method as in claim 2 wherein once said comparison operation indicates that said predetermined relationship exists, the driving strength characteristics of said plurality of second signal drivers are adjusted to produce the same driving strength characteristics as those of said first signal driver.

5. A method as in claim 1 wherein said comparison operation compares a voltage signal on said input data path with a reference voltage signal.

6. A method as in claim 1 wherein said calibration method is carried out only during a calibration mode of said memory device.

7. A method as in claim 6 wherein after said calibration mode is completed, said first signal driver ceases to provide a signal to said input data path.

8. A method as in claim 6 wherein said calibration mode is initiated in response to receipt of a calibration command.

9. A method as in claim 3 wherein said method further comprises first turning on one of said pull up and pull down driving elements and then turning on the other of said pull up and pull down driving elements so that both said pull up and pull down elements are on at the same time.

10. A method as in claim 2 wherein the drive strength of the weaker of said pull up and pull down driving elements is adjusted until said comparison operation indicates that said predetermined relationship has been obtained.

11. A method as in claim 2 wherein the drive strength of at least one of said pull up and pull down driving elements is adjusted incrementally until said comparison operation indicates that said predetermined relationship has been obtained.

12. A method as in claim 2 wherein the drive strength of only one of said pull up and pull down driving elements is adjusted until said comparison operation indicates that said predetermined relationship has been obtained.

13. A method as in claim 2 wherein the drive strength of only one of said pull up and pull down driving elements is adjusted incrementally until said comparison operation indicates that said predetermined relationship has been obtained.

14. A method as in claim 12 wherein said only one of said pull up and pull down driving elements is said pull down driving element.

15. A method as in claim 13 wherein said only one of said pull up and pull down driving elements is said pull down driving element.

16. A method as in claim 14 wherein said pull down driving element is at least one N-channel device.

17. A method as in claim 15 wherein said pull down driver is at least one N-channel device.

18. A method as in claim 1 wherein said input data path is a data masking input path which is connected to a data masking (DM) external pin on said memory device.

19. A method as in claim 1 wherein the adjusting of the signal driving strength characteristics of said plurality of second signal drivers occurs during the adjusting of the driving strength characteristics of said first signal driver.

20. A method as in claim 1 wherein the adjusting of the signal driving strength characteristics of said plurality of second signal drivers occurs after the adjusting of the driving strength characteristics of said first signal driver is completed.

21. A method as in claim 1 wherein said plurality of additional data paths comprise input/output DQ data paths.

22. A method as in claim 1 wherein the driving strength characteristics of said plurality of second drivers are adjusted to match the adjusted driving strength characteristics of said first signal driver.

23. A method of calibrating signal drivers for respective data paths of a memory device, said method comprising:
operating a first signal driver to produce a driving signal on an input data path of said memory device;
comparing the output signal from said first signal driver with a reference signal to provide a control signal;
adjusting the driving strength characteristics of said first signal driver in response to said control signal to obtain a predetermined relationship between said output signal and said reference signal in response to the result of said comparison; and
adjusting the driving strength characteristics of a plurality of second signal drivers, respectively provided to drive a plurality of additional data paths, in accordance with the driving strength adjustments made to said first signal driver after said comparison indicates that said predetermined relationship has been attained.

24. A method as in claim 23 wherein said calibration method is carried out only during a calibration mode of said memory device.

25. A method as in claim 24 wherein after said calibration mode is completed, said first signal driver ceases to provide a signal to said input data path.

26. A method as in claim 23 wherein each of said first and second driver circuits includes a pull up and pull down driving element and adjusting of the first and second driver circuits includes adjusting the drive strength of only the pull down element in each.

27. A method as in claim 26 wherein the pull down element in each of said first and second driver circuits is an N-channel device.

28. A method as in claim 23 wherein said input data path is a data masking input path which is connected to a data masking (DM) external pin on said memory device.

29. A memory device comprising:
a first driver for providing a driving signal to an input data path;
a plurality of second drivers for respectively providing driving signals to additional data paths;
a comparison circuit for comparing said driving signal on said input data path with a reference signal; and
a control circuit responsive to the output of said comparison circuit for adjusting the driving strength characteristics of said first driver circuit to achieve a predetermined comparative relationship between said driving signal on said input data path and said reference signal and for adjusting the driving strength characteristics of said second driver circuits in accordance with driving strength adjustments made to said first driver circuit.

30. A memory device as in claim 29 wherein said first driving circuit has pull up and pull down driving elements for driving said input data path, said control device adjusting the drive strength of at least one of said pull up and pull down driving elements in response to the output of said comparison circuit.

31. A memory device as in claim 29 wherein said control circuit causes said pull up and pull down elements to be on at the same time to produce said driving signal from said first driver.

32. A memory device as in claim 29 wherein said control circuit adjusts the driving strength characteristics of said first drive circuit in an incremental manner until said predetermined comparative relationship is obtained.

33. A memory device as in claim 29 wherein said control circuit first adjusts the driving strength characteristics of said first driver circuit until said predetermined comparative relationship is obtained, and thereafter adjusts the driving strength characteristics of said second driver circuits in accordance with adjustments made to said first driver circuit.

34. A memory device as in claim 29 wherein said control circuit adjusts the driving strength characteristics of said first and plurality of second driver circuits at substantially the same time until said predetermined comparative relationship is obtained.

35. A memory device as in claim 29 wherein the driving strength signal characteristics of said plurality of second driver circuits are adjusted to match adjusted driving strength signal characteristics of said first driver circuit.

36. A memory device as in claim 33 wherein the driving strength characteristics of said plurality of second driver circuits are adjusted to match adjusted driving strength characteristics of said first driver circuit.

37. A memory device as in claim 29 wherein said control circuit includes a calibration mode during which it is operative to adjust the driving strength characteristics of said first and plurality of second driver circuits, said control circuit further comprising a calibration input for receiving a signal instructing said control circuit to enter said calibration mode.

38. A memory device as in claim 37 wherein said control circuit ends said calibration mode after said predetermined comparative relationship is achieved and all driving strength adjustments have been made.

39. A memory device as in claim 29 wherein said comparison circuit is a receiver circuit for receiving external data which is present on said input data path.

40. A memory device as in claim 29 wherein said comparison circuit is a comparator which is different from a receiver for receiving external data which is present on said input data path.

41. A memory device as in claim 38 wherein said control circuit prevents said first driver circuit from generating a driving signal when said control circuit is not in said calibration mode.

42. A memory device as in claim 37 wherein said control circuit, in response to receipt of said instructing signal, turns on one of a pull up and pull down element of said first driver circuit, and thereafter turns on the other of said pull up and pull down element so that both said pull up and pull down elements are turned on to generate said driving signal from said first driver circuit.

43. A memory device as in claim 29 wherein said first driver circuit comprises pull up and pull down driving elements and said control circuit increases the drive strength of the weaker of said pull up and pull down driving elements until said comparison circuit indicates that said predetermined relationship has been obtained.

44. A memory device as in claim 29 wherein said first driver circuit comprises pull up and pull down driving elements and said control circuit adjusts the driving strength of only said pull down driving element.

45. A memory device as in claim 44 wherein said pull down driving element is at least one N-channel device.

46. A memory device as in claim 29 wherein said input data path is a data masking input path which is connected to an external data masking pin.

47. A memory device as in claim 29 wherein said additional data paths comprise input/output DQ data paths.

48. A processor system comprising:
a processor; and
at least one memory device connected to said processor, at least one of said processor and memory device comprising:
a first driver for providing a driving signal to an input data path;
a plurality of second drivers for respectively providing driving signals to additional data paths;
a comparison circuit for comparing said driving signal on said input data path with a reference signal; and
a control circuit responsive to the output of said comparison circuit for adjusting the driving strength characteristics of said first driver circuit to achieve a predetermined comparative relationship between said driving signal on said input data path and said reference signal and for adjusting the driving strength characteristics of said second driver circuits in accordance with driving strength adjustments made to said first driver circuit.

49. A system as in claim 48 wherein said first driving circuit has pull up and pull down driving elements for driving said input data path, said control device adjusting the drive strength of at least one of said pull up and pull down driving elements in response to the output of said comparison circuit.

50. A system as in claim 48 wherein said control circuit causes said pull up and pull down elements to be on at the same time to produce said driving signal from said first driver.

51. A system as in claim 48 wherein said control circuit adjusts the driving strength characteristics of said first drive circuit in an incremental manner until said predetermined comparative relationship is obtained.

52. A system as in claim 48 wherein said control circuit first adjusts the driving strength characteristics of said first driver circuit until said predetermined comparative relationship is obtained, and thereafter adjusts the driving strength characteristics of said second driver circuits in accordance with adjustments made to said first driver circuit.

53. A system as in claim 48 wherein said control circuit adjusts the driving strength characteristics of said first and plurality of second driver circuits at substantially the same time until said predetermined comparative relationship is obtained.

54. A system as in claim 48 wherein the driving strength characteristics of said plurality of second driver circuits are adjusted to match adjusted driving strength characteristics of said first driver circuit.

55. A system as in claim 54 wherein the driving strength characteristics of said plurality of second driver circuits are adjusted to match adjusted driving strength characteristics of said first driver circuit.

56. A system as in claim 48 wherein said control circuit includes a calibration mode during which it is operative to adjust the driving strength characteristics of said first and plurality of second driver circuits, said control circuit further comprising a calibration input for receiving a signal instructing said control circuit to enter said calibration mode.

57. A system as in claim 56 wherein said control circuit ends said calibration mode after said predetermined comparative relationship is achieved and all driving strength adjustments have been made.

58. A system as in claim 48 wherein said comparison circuit is a receiver circuit for receiving external data which is present on said input data path.

59. A system as in claim 48 said comparison circuit is a comparator which is different from a receiver for receiving external data which is present on said input data path.

60. A system as in claim 57 wherein said control circuit prevents said first driver circuit from generating a driving signal when said logic circuit is not in said calibration mode.

61. A system as in claim 56 wherein said control circuit, in response to receipt of said instructing signal, turns on one of a pull up and pull down element of said first driver circuit, and thereafter turns on the other of said pull up and pull down element so that both said pull up and pull down elements are turned on to generate said driving signal from said first driver circuit.

62. A system as in claim 48 wherein said first driver circuit comprises pull up and pull down driving elements and said control circuit increases the drive strength of the weaker of said pull up and pull down driving elements until said comparison circuit indicates that said predetermined relationship has been obtained.

63. A system as in claim 48 wherein said first driver circuit comprises pull up and pull down driving elements and said control circuit adjusts the driving strength of only said pull down driving element.

64. A system as in claim 63 wherein said pull down driving element is at least one N-channel device.

65. A system as in claim 48 wherein said input data path is a data masking input path which is connected to an external data masking pin.

66. A system as in claim 48 wherein said additional data paths comprise input/output DQ data paths.

* * * * *

UNITED STATES PATENT AND TRADEMARK OFFICE
CERTIFICATE OF CORRECTION

PATENT NO. : 6,330,194 B1
DATED : December 11, 2001
INVENTOR(S) : Mark R. Thomann et al.

It is certified that error appears in the above-identified patent and that said Letters Patent is hereby corrected as shown below:

<u>Column 2,</u>
Line 5, replace "tuning" with -- timing --.

Signed and Sealed this

Twenty-sixth Day of March, 2002

Attest:

Attesting Officer

JAMES E. ROGAN
*Director of the United States Patent and Trademark Office*